US008318604B2

(12) United States Patent
Cui et al.

(10) Patent No.: US 8,318,604 B2
(45) Date of Patent: Nov. 27, 2012

(54) SUBSTRATE COMPRISING A NANOMETER-SCALE PROJECTION ARRAY

(75) Inventors: Yi Cui, Sunnyvale, CA (US); Jia Zhu, Stanford, CA (US); Ching-Mei Hsu, Stanford, CA (US); Stephen T. Connor, San Francisco, CA (US); Zongfu Yu, Stanford, CA (US); Shanhui Fan, Stanford, CA (US); George Burkhard, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 1 day.

(21) Appl. No.: 12/948,025

(22) Filed: Nov. 17, 2010

(65) Prior Publication Data
US 2011/0121431 A1 May 26, 2011

Related U.S. Application Data

(60) Provisional application No. 61/263,582, filed on Nov. 23, 2009.

(51) Int. Cl.
*H01L 21/3065* (2006.01)
(52) U.S. Cl. .................. 438/705; 257/E21.218
(58) Field of Classification Search .................. None
See application file for complete search history.

(56) References Cited

U.S. PATENT DOCUMENTS

| 6,806,141 | B2 * | 10/2004 | Kamins | 438/270 |
| 7,106,938 | B2 | 9/2006 | Baek et al. | |
| 2009/0325365 | A1 * | 12/2009 | Park et al. | 438/478 |

OTHER PUBLICATIONS

Law et al., "Nanowire dye-sensitized solar cells", "nature materials—Letters www.nature.com/naturematerials", Jun. 2005, vol. 4, Publisher: Nature Publishing Group, Published in: US.
Deckman et al., "Applications of surface textures produced with natural lithography", "Journal of Vacuum Science & Technology B", Oct.-Dec. 1983, pp. 1109-1112, vol. 1, No. 4, Publisher: American Vacuum Society, Published in: US.
Zhu et al., "Nanodome Solar Cells with Efficient Light Management and Self-Cleaning", "NanoLetters 2010 XP-002632310", 2010, pp. 1979-1984, Publisher: American Chemical Society, Published in: US.
Zhu et al., "Nanostructured photon management for high performance solar cells", "Materials Science and Engineering R 70 XP-027537230", 2010, pp. 330-340, Publisher: Elsevier B.V.
Hsu et al., "Wafer-scale silicon nanopillars and nanocones by Langmuir-Blodgett assembly and etching", "Applied Physics Letters XP-012111721", 2008, pp. 133109-1-133109-3, vol. 93, No. 13, Publisher: American Institute of Physics, Published in: US.
Rosello Garcia, M., "PCT Application No. PCT/US2010/053576 International Search Report May 24, 2011",,Publisher: PCT, Published in: PCT.
Atwater et al., "Plasmonics for improved photovoltaic devices", "Nature Materials www.nature.com/naturematerials", Mar. 2010, pp. 205-213, vol. 9, Publisher: Macmillan Publishers Limited.
Rosello Garcia, M., "PCT Application No. PCT/US2010/053576 Written Opinion Dec. 27, 2011",, Publisher: PCT, Published in: PCT.

* cited by examiner

*Primary Examiner* — Seahvosh Nikmanesh
(74) *Attorney, Agent, or Firm* — Kaplan Breyer Schwartz & Ottesen, LLP

(57) ABSTRACT

A method for forming a substrate comprising nanometer-scale pillars or cones that project from the surface of the substrate is disclosed. The method enables control over physical characteristics of the projections including diameter, sidewall angle, and tip shape. The method further enables control over the arrangement of the projections including characteristics such as center-to-center spacing and separation distance.

30 Claims, 8 Drawing Sheets

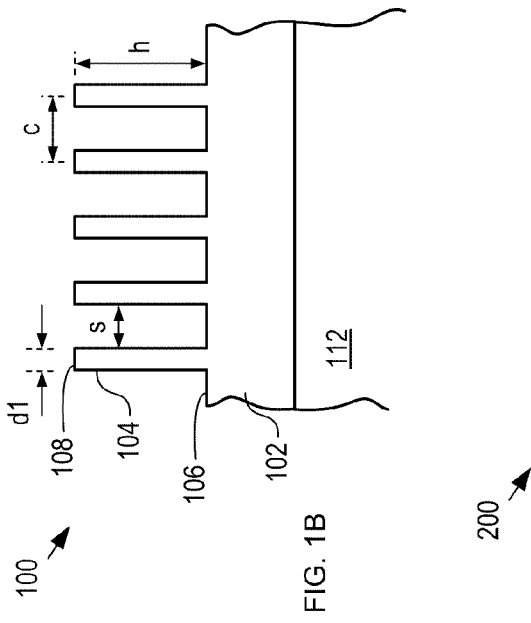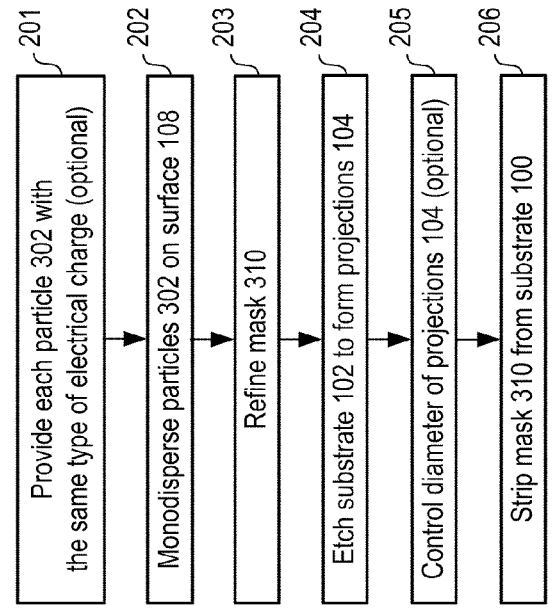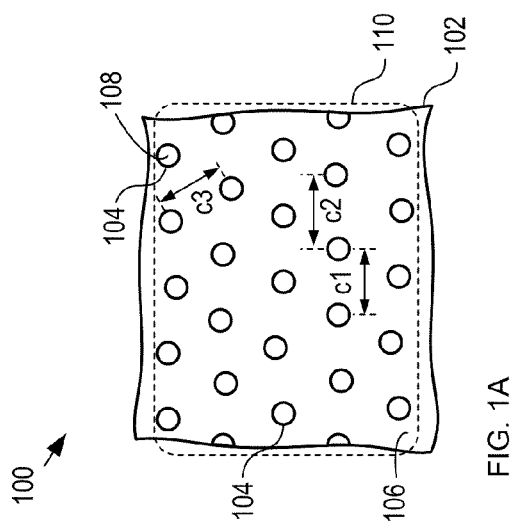

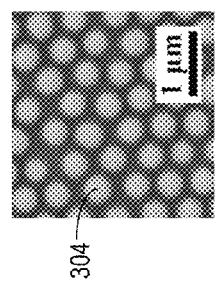
FIG. 3D
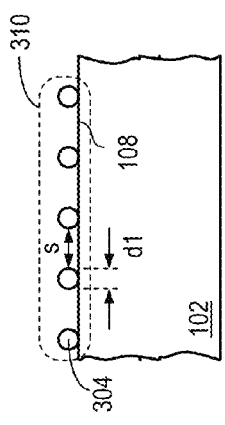
FIG. 3F
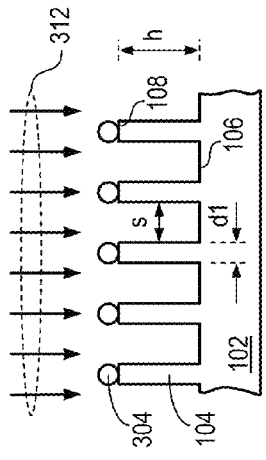
FIG. 3H
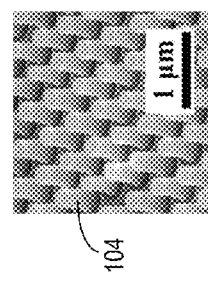
FIG. 3E
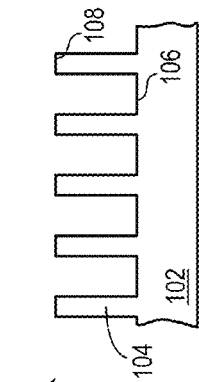
FIG. 3G
FIG. 3I

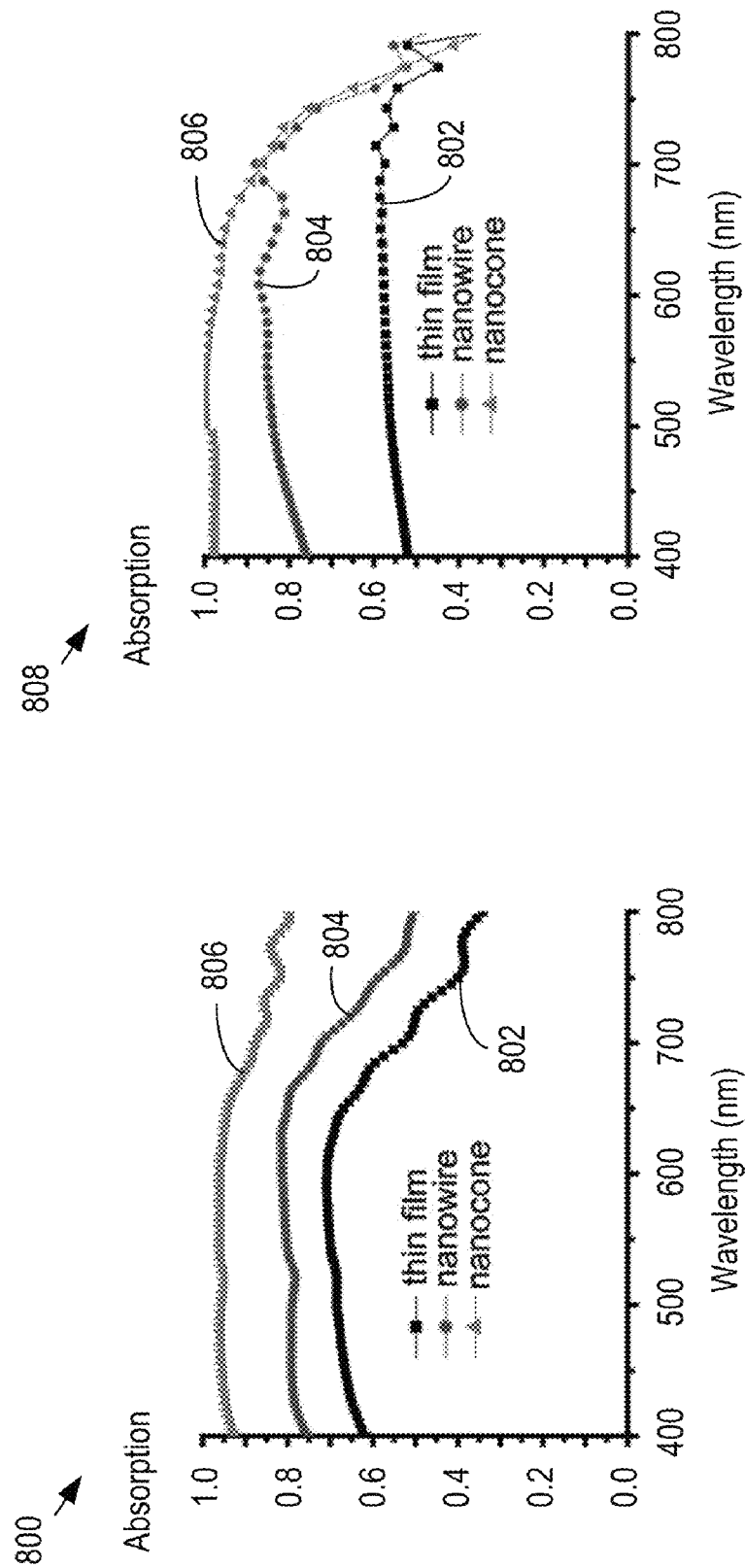

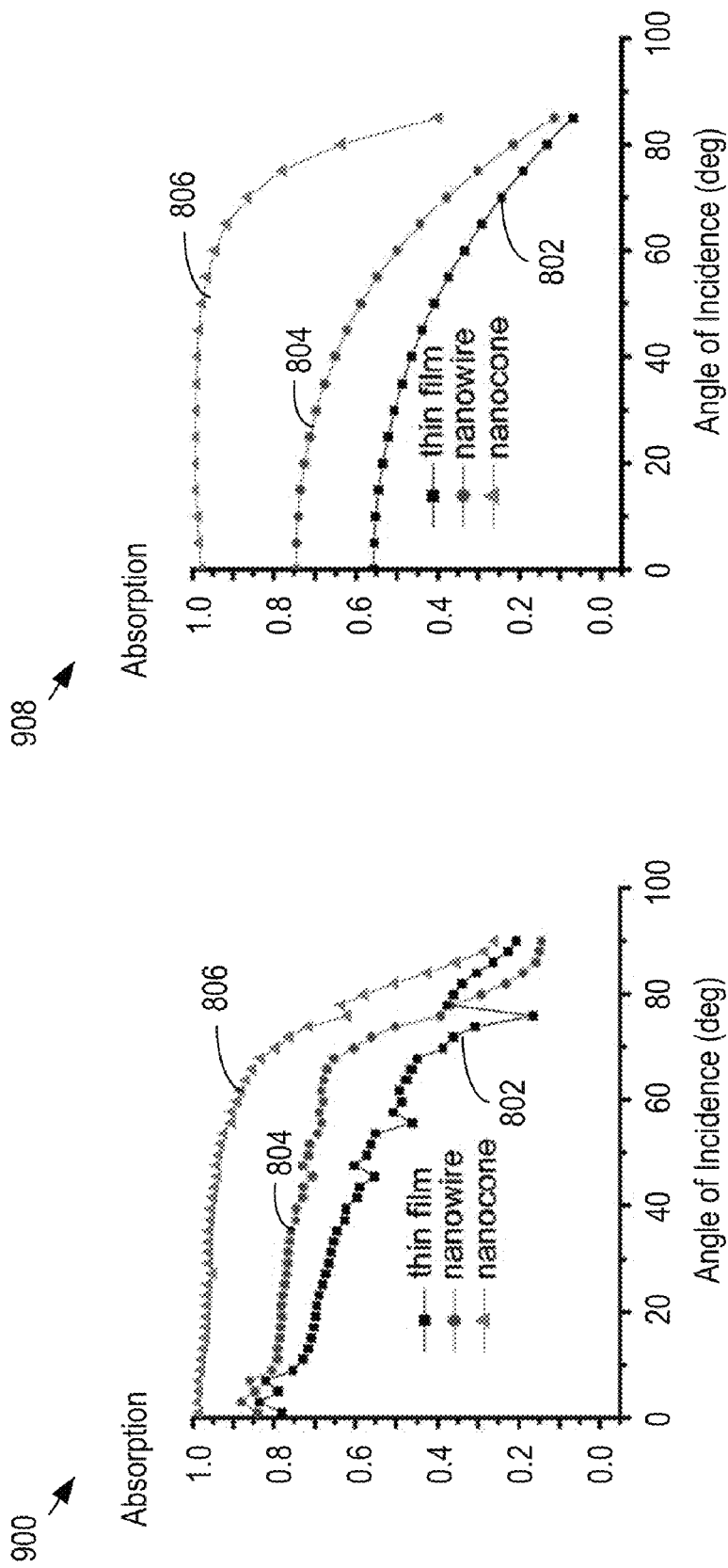

SUBSTRATE COMPRISING A NANOMETER-SCALE PROJECTION ARRAY

CROSS-REFERENCE TO RELATED APPLICATION

This application claims the benefit of U.S. Provisional Patent Application Ser. No. 61/263,582, filed Nov. 23, 2009, entitled "Substrate Comprising a Nanometer-scale Projection Array,", which is incorporated herein by reference.

STATEMENT REGARDING FEDERALLY SPONSORED RESEARCH

This invention was made with Government support under contract DE-FG36-08GO18004 awarded by the Department of Energy. The Government has certain rights in the invention.

FIELD OF THE INVENTION

The present invention relates to semiconductor devices in general, and, more particularly, to optoelectronic semiconductor devices.

BACKGROUND OF THE INVENTION

Semiconductor devices, such as RFID devices, solar cells, lasers, photodetectors, optical modulators, light emitting diodes, and the like, represent important classes of devices. These semiconductor devices are enabling devices for applications across a broad range of areas, including integrated circuit manufacture and test, RFID labeling, medicine, optical telecommunications, military, analytical, astronomy, and energy conversion, to name just a few.

Vertical arrays of nanopillars, nanowires or nanocones have been sought after for use in many of these applications. For example, vertical silicon nanopillars with aspect ratios less than 5 have been used as nano-imprint mask masters. In addition, vertical nanowire arrays of larger aspect ratios have been exploited in solar cells structures and vertical field effect transistors.

With regard to optoelectronic semiconductor devices, prior-art studies have demonstrated that a tapered geometry in vertical nanocone arrays can reduce light reflection via refractive index matching. Such structures are also suitable for use as scanning probe tips.

Nanowire-based devices have also shown potential to improve battery performance. Silicon and germanium nanowires have been used as negative electrodes in lithium-ion batteries.

For many of prior-art applications, it is important to precisely control diameter, spacing and shape of the vertical nanostructures. It is also important that the nanostructure arrays are fabricated over a large area with high throughput and low cost. Several prior-art methods have been developed to fabricate such arrays.

Nanowire arrays have been synthesized by vapor liquid solid growth with diameter control. Obtaining nanowires with small spacing between them has been challenging, however, due the propensity for the metal-catalyst particles to merge at growth temperatures.

Alternatively, nanowires have been made by solution chemistry. Unfortunately, the control of spacing and diameter of nanowires fabricated using this method is limited.

Electron-beam lithography and etching have been used in combination to form features smaller than 10 nm. The cost this approach is prohibitive, however. In addition, the throughput is low.

Photolithography is a tempting method, although the cost is too high for many applications.

In order to exploit the advantages afforded by substrates comprising arrays of nanometer-scale projections, an inexpensive, high-throughput fabrication method that provides good control over the physical characteristics of the projections would represent a significant advance in the state-of-the-art.

SUMMARY OF THE INVENTION

The present invention enables semiconductor devices that have improved performance and/or improved optical absorption compared to devices known in the prior art. Embodiments of the present invention are particularly well-suited for probe arrays, RFID devices, nano-imprinting devices, batteries, solar cells, semiconductor lasers, light-emitting diodes, optical modulators, and photodetectors.

The present invention provides a method for forming substrates having a plurality of substantially uniform-sized nanometer-scale projections that project from one surface of the substrate. The projections are formed by etching the substrate surface to remove substrate material between the projections. The present invention enables the controlled fabrication of substrates wherein each of the projections is a "nanopillar" that has a cross-sectional area that are substantially uniform along their length. The present invention also enables the controlled fabrication of substrates wherein each of the projections is a "nanocone" that has a cross-sectional area that reduces in size from the base of the projection to its free-end. Depending upon the fabrication conditions selected, each projection can be formed with a substantially rounded tip, sharp tip, or substantially flat tip.

Substrates in accordance with the present invention are characterized by higher light absorption than comparable planar layers comprising the same material. As compared to planar layers of the same material, substrates in accordance with the present invention are characterized by:
  i. higher overall absorption; or
  ii. higher absorption over a broader wavelength range; or
  iii. higher absorption over a wider range of angles of incidence; or
  iv. any combination of i, ii, and iii.

A method in accordance with the present invention comprises forming a mask comprising a hexagonal close-packed arrangement of silica spheres on the top surface of a hydrogenated amorphous silicon layer. After the silica spheres are disposed on the top surface, their diameter is optionally fine-tuned in a first etch that etches silicon dioxide faster than silicon. Once the spheres have their desired diameter, the substrate is etched in a second etch that is anisotropic and etches silicon faster than silicon dioxide. The mask is then stripped from the substrate in a third etch that etches silicon dioxide faster than silicon.

An embodiment of the present invention comprises a method for forming a substrate comprising a plurality of projections, wherein the method comprises: forming a mask layer on a first surface of the substrate, wherein the substrate comprises a first material, and wherein the mask layer comprises a plurality of first particles of a second material, and further wherein the plurality of first particles is arranged as a monolayer on the first surface; and etching the substrate in a first etch, wherein the first etch etches the first material at a faster rate than that the second material.

BRIEF DESCRIPTION OF THE DRAWINGS

FIG. 1A depicts a schematic diagram of a top view of a portion of a substrate in accordance with an illustrative embodiment of the present invention.

FIG. 1B depicts a schematic diagram of a side view of a portion of a substrate in accordance with an illustrative embodiment of the present invention.

FIG. 2 depicts operations of a method suitable for providing substrate 100 in accordance with the illustrative embodiment of the present invention.

FIGS. 3A-I depict substrate 100 at different phases of formation in accordance with the illustrative embodiment of the present invention.

FIG. 8A depicts a comparison of the absorptivity, over a broad range of wavelengths, for different types of hydrogenated amorphous silicon substrates.

FIG. 8B depicts simulation results for the absorptivity, over a broad range of wavelengths, for different types of hydrogenated amorphous silicon substrates.

FIG. 9A depicts a comparison of the absorptivity, over a broad range of angles of incidence, for different types of hydrogenated amorphous silicon substrates.

FIG. 9B depicts simulation results for the absorptivity, over a broad range of angles of incidence, for different types of hydrogenated amorphous silicon substrates.

DETAILED DESCRIPTION

Figure 3A:
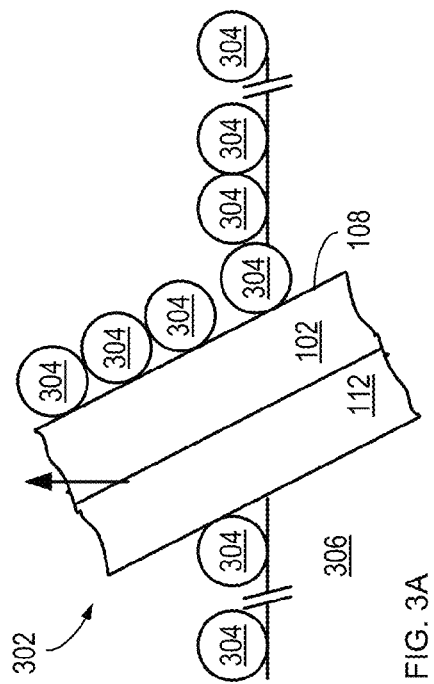

FIGS. 1A and 1B depict schematic diagrams of top and side views, respectively, of a portion of a substrate in accordance with an illustrative embodiment of the present invention. Substrate 100 comprises layer 102 and a plurality of projections 104.

Substrate 100 enables semiconductor devices that have high operating efficiency compared to semiconductor devices known in the prior art. Embodiments of the present invention are particularly well-suited for use in the formation of high-resolution probes, solar cells, semiconductor lasers, light-emitting diodes, optical modulators, and photodetectors.

Further, substrate 100 provides a surface that is more absorptive for a large range of wavelengths of light as well as for light that is received over a wide range of incident angles. The range of wavelengths and incident angles for which substrate 100 is highly absorbent are significantly larger than those of conventional planar surface substrates of the prior art, as is discussed below and with reference to FIGS. 8A, 8B, 9A, and 9B.

Layer 102 is a layer of hydrogenated amorphous silicon (a-Si:H), which is disposed on handle substrate 112. Projections 104 are etched into surface 108 of layer 102 and project from etched surface 106.

Projections 104 are pillar-shaped projections having a substantially uniform diameter, d1, along their height, h. Projections 104 are arranged on surface 106 in substantially uniform arrangement 110. In the illustrative embodiment, arrangement 110 is a hexagonal close-packed arrangement. In some embodiments, arrangement 110 is other than a hexagonal close-packed arrangement.

It should be noted that the center-to-center spacing, c, of projections 104 is the average of the center-to-center spacings between adjacent pairs of the projections of substrate 100. Projections 104 are arranged on surface 106 in a hexagonal close-packed arrangement. As a result, the distance between the centers of adjacent projections is dictated by where those projections are within the overall arrangement. In addition, in practice, the arrangement of projections will naturally include some local variations from that of a perfect hexagonal close-packed arrangement (e.g., line defects, point defects, etc.). For example, the projections 104 of substrate 100 have three different center-to-center spacings, c1, c2, and c3. Differences between these center-to-center spacings (and their related separation distances) are slight, however; therefore, for the purposes of this specification, including the appended claims, "center-to-center spacing" and "separation distance" are defined as the average center-to-center spacing and average separation distance between the projections of the arrangement. The center-to-center spacing, c, for substrate 100, therefore, is the average of c1, c2, and c3. In similar fashion, the separation distance, s, for substrate 100 is the average separation distance between adjacent projection pairs of the arrangement.

FIG. 2 depicts operations of a method suitable for providing substrate 100 in accordance with the illustrative embodiment of the present invention. Method 200 is described herein with continuing reference to FIGS. 1A and 1B as well as with reference to FIGS. 3A-I.

FIGS. 3A-I depict substrate 100 at different phases of formation in accordance with the illustrative embodiment of the present invention.

Method 200 begins with optional operation 201, wherein each of a plurality of particles 304 is provided with the same electrical charge type. In other words, after operation 201, all of particles 304 are either charged positive or charged negative. It should be noted that, in practice, operation 201 a small number of particles 304 might not have the same type of charge as the remaining particles at the conclusion of operation 201.

Particles 304 are spherically shaped silica (i.e., silicon dioxide) particles prepared by a modified Stroeber technique, such as is described by Bogush, Tracy, and Zukoski in "Preparation of monodisperse silica particles: Control of size and mass fraction," in the *Journal of Non-crystalline Solids*, Vol. 104, (1988), pp. 95-106, which is incorporated by reference herein. Using this technique, the diameter, d2, of particles 304 can be readily controlled within the range of approximately 50 nanometers (nm) to approximately 800 nm.

In some embodiments, silica particles are produced through hydrolysis and condensation of an appropriate solution. In some embodiments, particles 304 are provided by precipitating silica particles from an ethanol solution that contains ammonia, water, and tetraethylorthosilicate, such as is described by Stroeber, Fink, and Bohn in "Controlled Growth of Monodisperse Silica Spheres in the Micron Size Range," in the *Journal of Colloid and Interface Science*, Vol. 26 (1968) pp. 62-69, which is incorporated by reference herein. In some embodiments, particles 304 are procured from a commercial source. In some embodiments, particles 304 comprise a material other than silica, such as metals, dielectrics, ceramics, semiconductors, polymers, composites, and the like.

In order to provide each of particles 304 with the same electrical charge type, the silica particles are modified with aminopropyl diethoxysilane to terminate them with positively charged amine groups. When particles 304 are each characterized by the same electrical charge type, aggregation of the particles is reduced or prevented. In some embodiments, each of particles 304 is provided with a negative charge. In some embodiments, particles 304 are charged in a way that differs from operation 201. It will be clear to one skilled in the art, after reading this specification, how to provide the same type of electrical charge on each of particles 304.

At operation 202, a monolayer of particles 304 is formed on surface 108 of wafer 302. In the illustrative embodiment, particles 304 are assembled onto surface 108 by means of a Langmuir-Blodgett method. The Langmuir-Blodgett method begins by immersing wafer 302 into the liquid 306, the surface of which is covered with particles 304.

Wafer 302 comprises layer 102 disposed on handle substrate 112. Layer 102 is a layer of hydrogenated amorphous silicon. Handle substrate 112 has a thickness suitable for maintaining structural integrity of wafer 302 after the formation of projections 104.

The use of hydrogenated amorphous silicon as layer 102 affords advantages to embodiments of the present invention in many applications, such as thin film transistors (TFTs), solar cells, RFID devices, photodetectors, light-emitting diodes, and lasers. In some embodiments, the advantages of hydrogenated amorphous silicon over its crystalline form derive from the fact that it can be deposited by plasma-enhanced chemical vapor deposition at low temperatures (100-250° C.). As a result, hydrogenated amorphous silicon can be deposited on a wide-range of substrate materials including semiconductors, glass, plastics, and metals, such as stainless steel. This enables low-cost, roll-to-roll processing of optoelectronic or microelectronic devices.

The fabrication techniques described herein are also suitable for fabrication of substrates comprising projections 104 using materials other than hydrogenated amorphous silicon. As a result, although in the illustrative embodiment layer 102 is hydrogenated amorphous silicon, it will be clear to one skilled in the art, after reading this specification, how to specify, make, and use alternative embodiments of the present invention wherein layer 102 comprises one or more materials other than hydrogenated amorphous silicon. Materials suitable for use in wafer 302 include, without limitation, silicon, polysilicon, amorphous silicon, glass, compound semiconductors, and the like. Further, it will be clear to one skilled in the art, after reading this specification that wafer 302 can be a substantially homogeneous bulk substrate of suitable material. Bulk substrates suitable for use in the present invention include, without limitation, hydrogenated amorphous silicon, crystalline silicon, polysilicon, amorphous silicon, glass, compound semiconductors, ceramics, and the like.

FIG. 3A depicts wafer 302 during its removal from liquid 306. As wafer 302 is drawn from liquid 306, particles 304 are adsorbed on surface 108, as shown. Once wafer 302 is removed from liquid 306, particles 304 form a hexagonal close-packed monolayer on surface 108. This monolayer of particles provides the basis for formation of a mask layer suitable for enabling the formation of projections 104.

Figure 3B:
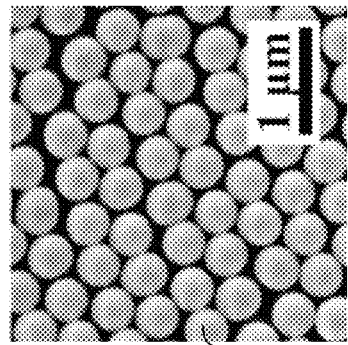

FIG. 3B depicts an image of a portion of a substrate surface comprising an arrangement of particles 304.

At operation 203, the size of particles 304 is adjusted by etching particles 304 in reactive-ion etch 308.

Figure 3C:
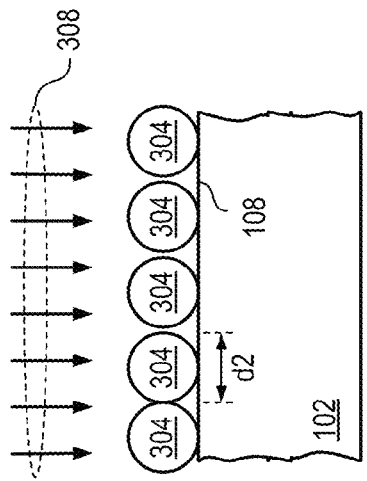

FIG. 3C depicts a schematic drawing of substrate 100 during etch 308. Reactive-ion etch 308 is characterized by an etch rate that is significantly higher for silicon dioxide that for hydrogenated amorphous silicon. In other words, the reactive-ion etch 308 selectively etches the material of particles 304 over the material of layer 102. At the onset of operation 203, each particle 304 has its as-deposited diameter of d2. The diameter of particles 304, which are arranged in a close-packed arrangement on surface 108, dictate their center-to-center spacing, s, in arrangement 110.

One skilled in the art will recognize that there are numerous reactive-ion etches that have significant selectivity for silicon dioxide over silicon. One exemplary reactive-ion etch 308 suitable for etching silicon dioxide over silicon is based on a mixture of oxygen gas ($O_2$) and a fluorine-containing gas, such as carbon trifluoromethane ($HF_3$). One skilled in the art will also recognize that there are numerous methods other than reactive-ion etching that can be used to controllably remove material from particles 304 without significantly removing substrate material, such as wet-chemical etches, laser-assisted etching, oxide desorption, plasma etching, and the like.

It should be noted that, in addition to enabling control over physical attributes of particles 304, such as particle size and spacing, operation 203 also beneficially removes native oxide from surface 108. The removal of this native oxide from surface 108 facilitates subsequent operation 204, wherein projections 104 are formed.

FIG. 3D depicts a side view of a portion of substrate 100 after reaction ion etch 308.

FIG. 3E depicts an image of a portion of a substrate surface after reaction ion etch 308.

Mask layer 310 comprises particles 304, which, after operation 203, have diameter, d1. Adjacent pairs of particles 304 are separated by separation distance, s, which has a value equal to c-d1.

At operation 204 projections 104 are formed by etching layer 102 in reactive-ion etch 312.

FIG. 3F depicts a schematic drawing of a portion of substrate 100 during etch 312. Reactive ion etch 312 is a substantially directional etch that etches hydrogenated amorphous silicon at a faster rate than silica. In other words, reactive-ion etch 312 is an anisotropic etch that is substantially selective for the material of layer 102 over the material of mask 310.

One skilled in the art will recognize that there are numerous reactive-ion etches that have significant selectivity for silicon over silicon dioxide. One exemplary reactive-ion etch 312 suitable for etching silicon over silicon dioxide is based on a chlorine-containing gas, such as chlorine ($Cl_2$). One skilled in the art will also recognize that there are methods other than reactive-ion etching that can be used to controllably remove material from layer 102 without significantly removing material from particles 304, such as wet-chemical etches, laser-assisted etching, oxide desorption, plasma etching, and the like.

After reactive-ion etch 312, projections 104 project from newly exposed surface 106 of layer 102. The height, h, of projections 104 is base on the etch parameters of reactive-ion etch 312 and its duration. Because reactive-ion etch 312 is highly directional, projections 104 are nanometer-scale pillars (i.e., nanopillars) having a diameter that is substantially uniform through their length. The diameter of the nanopillars is substantially equal to the diameter, d1, of particles 304.

It should be noted that in practice, however, some tapering of the nanopillars can occur during etch 312 as a result of several factors. First, during reactive-ion etching, reactive ions arrive at the surface of layer 102 over a range of angles of incidence. As a result, some undercutting of the exposed sidewalls of the nanopillars occurs during the etch process. Second, typical silicon/silicon dioxide etch selectivity is between 25 and 30; therefore, some erosion of particles 304 occurs during reactive-ion etch 312. This erosion leads also leads to sidewall tapering through the duration of the etch process. Third, during reactive-ion etch 312, etch products can redeposit on the exposed sidewalls. The redeposition rate tends to decrease from the bottom to the top of the nanopillars.

FIG. 3G depicts an image of a portion of a substrate surface comprising an array of projections 104 before the stripping of mask 310. Some attack of particles 304 during etch 312 is clearly evident.

At optional operation 205, the diameter of projections 104 is adjusted by reducing the diameter to a desired value.

Figure 4:
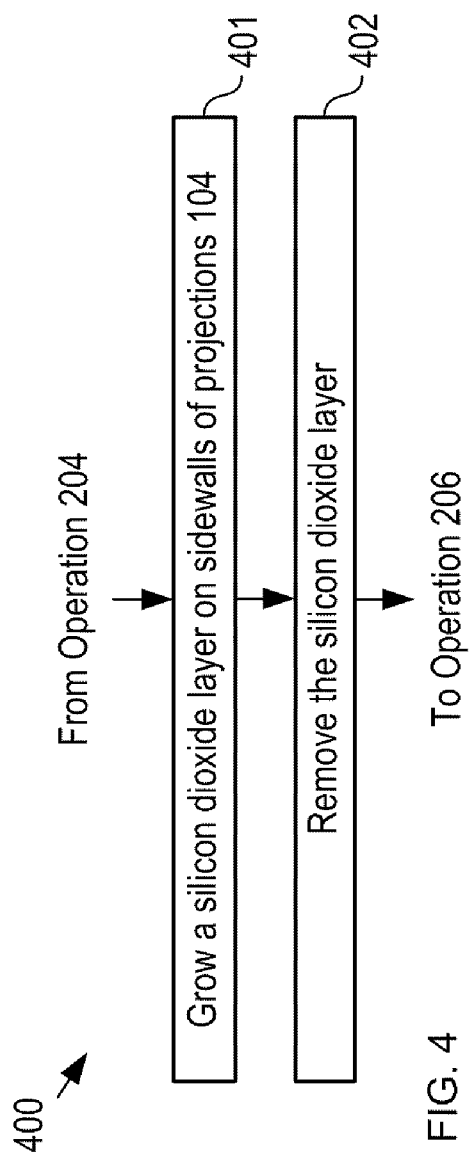
FIG. 4 depicts sub-operations suitable for reducing the diameter of projections 104.

FIG. 4 depicts sub-operations suitable for reducing the diameter of projections 104.

At sub-operation 401, the exposed silicon surfaces of layer 102 and projections 104 are oxidized to form a thin layer of silicon dioxide. The thickness of the developed silicon dioxide is based on the amount of silicon material to be removed from projections 104.

At sub-operation 402, the silicon dioxide layer is removed in a hydrofluoric acid-based wet etch. Since the growth of silicon dioxide on a silicon surface consumes some of the exposed silicon, the diameter of projections 104 is smaller after completion of operation 205. Surfaces 108 of projections 104 are protected during operation 205, however. As a result, the height of projections 104 remains unchanged. Sub-operations 401 and 402 can be repeated as many times as necessary to achieve a desired final diameter of projections 104.

At operation 206, mask 310 is stripped from surfaces 108 in an etch that is selective for silicon dioxide over silicon (e.g., a hydrofluoric acid-based wet etch, etc.).

FIG. 3H depicts a schematic drawing of a portion of substrate 100 after the stripping of mask 310.

FIG. 3I depicts an image of a portion of a substrate surface comprising an array of projections 104 after the stripping of mask 310.

In some cases, it is desirable for projections 104 to have a conical shape rather than a pillar shape. For example, the ease of fabrication and/or performance of many semiconductor devices is improved by projections 104 that are nanocones rather than nanopillars.

Figure 5:
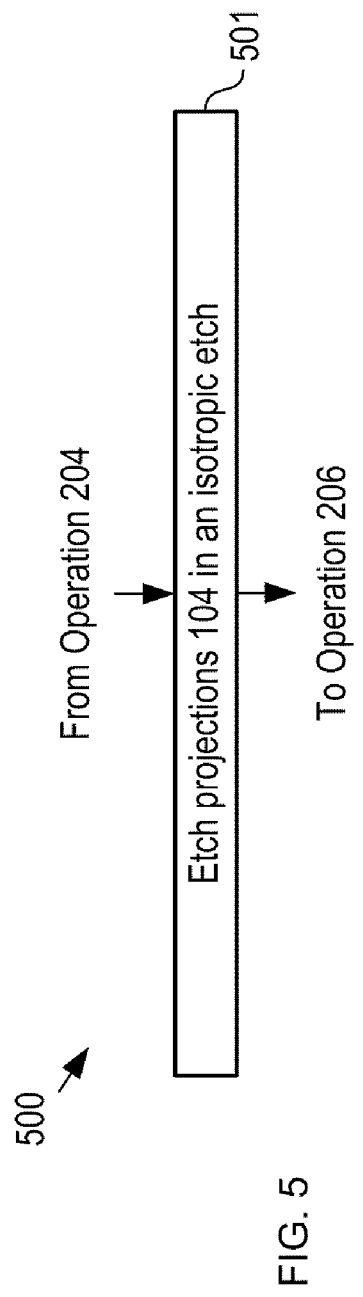
FIG. 5 depicts an operation suitable for forming a nanocone substrate from a nanopillar substrate in accordance with a first alternative embodiment of the present invention.

FIG. 5 depicts an operation suitable for forming a nanocone substrate from a nanopillar substrate in accordance with a first alternative embodiment of the present invention. Method 500 comprises operation 501, which is performed between operations 204 and 206 of method 200 described above. At operation 501, layer 102 and projections 104 are subjected to an etch that etches silicon in a substantially isotropic manner.

Figure 6A:
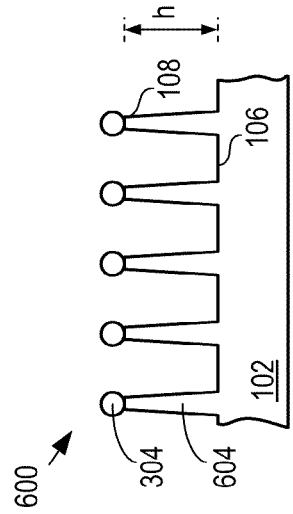
FIG. 6A depicts the formation of a nanocone substrate from a nanopillar substrate in accordance with the first alternative embodiment of the present invention.

FIG. 6A depicts the formation of a nanocone substrate from a nanopillar substrate in accordance with the first alternative embodiment of the present invention. Substrate 100 is subjected to etch 602, which is a reactive-ion etch based on a gas mixture comprising a chlorine-containing gas such as chloropentafluoroethane ($C_2ClF_5$), and sulfur hexafluoride ($SF_6$). One skilled in the art will recognize that gas mixture represents merely one potential etch that is substantially isotropic for silicon.

During etch 602, particles 304 of mask 310 are undercut by energetic ions. The rate at which silicon is removed near the top of projections 104 is typically higher than the rate at which silicon is removed near the bottom of the projections due to less efficient mass transport at the bottom of the openings between projections 104 (particularly when s is small). As a result, etch components are not refreshed as quickly near substrate surface 106 and the etch rate of silicon slows.

Figure 6B:
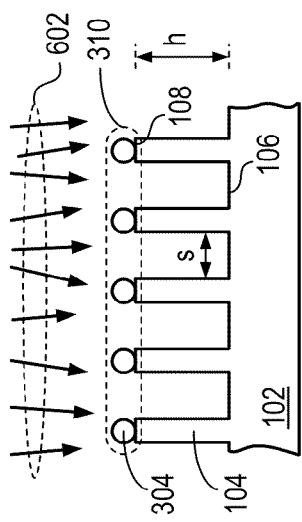
FIG. 6B depicts a schematic drawing of a side view of a nanocone substrate in accordance with the first alternative embodiment of the present invention.

FIG. 6B depicts a schematic drawing of a side view of a nanocone substrate in accordance with the first alternative embodiment of the present invention. Nanocone substrate 600 comprises layer 102 and nanocones 604, which project from surface 106.

Figure 6C:
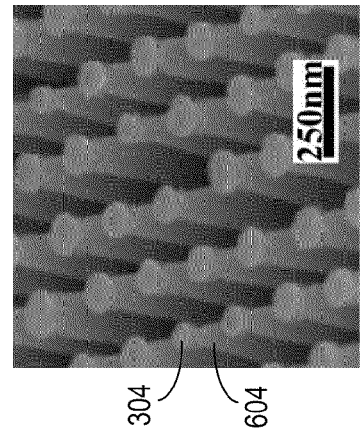
FIG. 6C depicts a side view of a single nanocone of a nanocone substrate.

FIG. 6C depicts a side view of a single nanocone of a nanocone substrate. The isotropic nature and etch conditions of etch 602 impart a taper angle, $\theta$, to sidewall 606 of nanocones 604. One skilled in the art will recognize that the degree of undercutting and the taper angle, $\theta$, are based on specific etch conditions, such as RF power level, voltage bias, substrate clamping and cooling, spacing, s, etc. Since surfaces 108 of projections 104 were still protected by particles 304 during etch 602, the height of nanocones 604 remains equal to h. Further, the conditions and duration of etch 602 are selected so that a portion of surface 108 remains unaffected. As a result, nanocones 604 have a substantially flat top surface. It should be noted that in some embodiments, sidewall 606 is not straight as shown, but instead has a non-linear shape due to etch conditions.

Figure 6D:
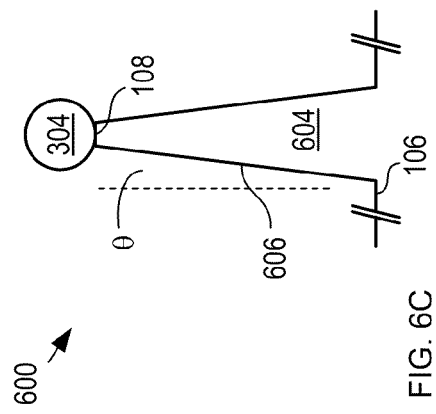
FIG. 6D depicts an image of a portion of a nanocone substrate.

FIG. 6D depicts an image of a portion of a nanocone substrate.

Figure 7B:
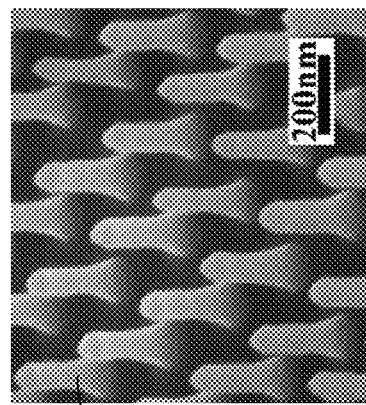
FIG. 7B depicts an image of a portion of a nanocone substrate in accordance with the second alternative embodiment of the present invention.
Figure 7C:
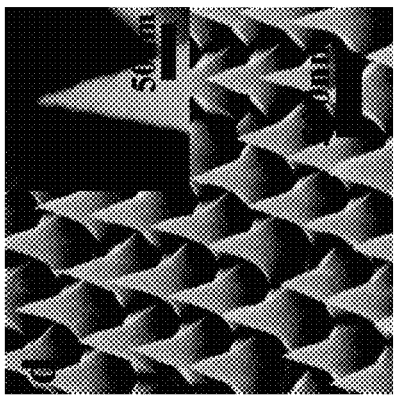
FIG. 7C depicts an image of a portion of a nanocone substrate comprising projections with sharp tips.
Figure 7A:
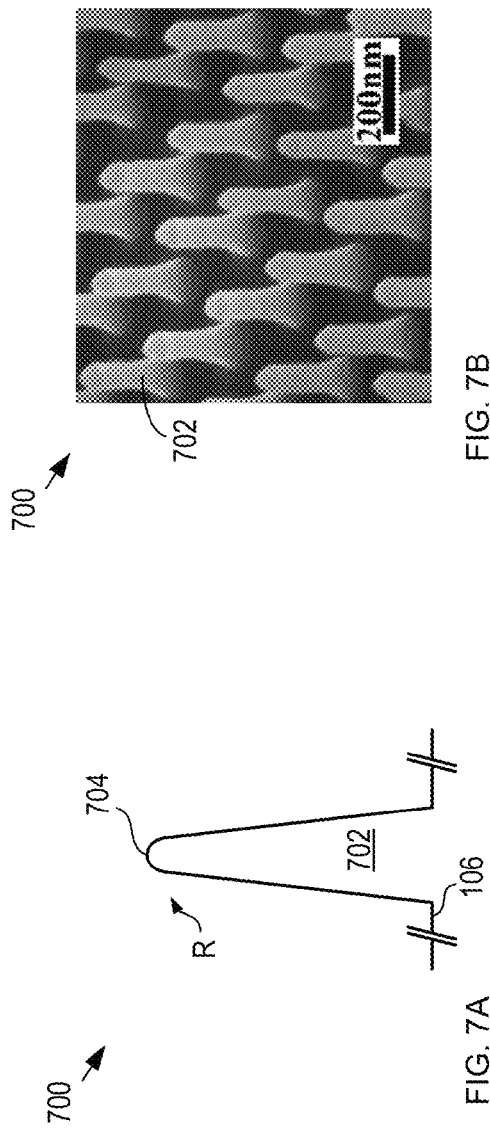
FIG. 7A depicts a view of a single nanocone in accordance with a second alternative embodiment of the present invention.

FIG. 7A depicts a view of a single nanocone in accordance with a second alternative embodiment of the present invention. Nanocone substrate 700 comprises layer 102 and nanocones 702, which project from surface 106. Nanocones 702 are formed in the same manner as nanocones 604; however, the etch conditions and/or duration of etch 602 are such that the tip 704 is substantially rounded and has radius of curvature, R. In some embodiments, R is as small as approximately 3-5 nm.

FIG. 7B depicts an image of a portion of a nanocone substrate in accordance with the second alternative embodiment of the present invention.

In some embodiments, such those suitable for microprobe array applications, it is desirable for projections 104 to have very sharp tips. By judicious choice of etching conditions and etch duration, sharp tips can be formed at the free-ends of projections 104.

FIG. 7C depicts an image of a portion of a nanocone substrate comprising projections with sharp tips.

In embodiments of the present invention wherein layer 102 (or wafer 302) comprises a material other than silicon and/or particles 304 comprise a material other than silicon dioxide, it will be clear to one skilled in the art, after reading this specification, how to specify, make, and use appropriate alternative etches to etches 308, 312, and 602 to fabricate substrate 100.

The optical properties of a nanopillar or nanocone substrate are significantly different from the optical properties of a conventional planar substrate comprising the same material. Due to the high refractive index of hydrogenated amorphous silicon, for example, a large percentage of incident light is reflected back from the surface of a planar surface of hydrogenated amorphous silicon. The reflected light is not absorbed by the material and does not produce a useful effect, such as the generation of photocarriers in a photodetector or current in a solar cell. In order to reduce the reflectivity of such a layer, prior-art devices have relied upon a deposited anti-reflection coating disposed on the surface of the layer. Such coatings can reduce the reflectivity of light over a narrow wavelength-range and over a narrow range of angles of incidence. Unfortunately, they are substantially ineffective for broad wavelength-ranges and for light incident over a broad range of angles.

In contrast, nanopillar and nanocone substrates, such as substrates 600 and 700, provide improved optical impedance matching through a gradual reduction of the effective refractive index at the surface of layer 102. This results in suppressed reflectivity for embodiments of the present invention—over both a wide wavelength-range and a broad range of angles of incidence.

The reduced reflectivity of nanopillar and nanocone substrates arises from the fact that these structures are characterized by an effective refractive index. The effective refractive index is substantially the average refractive index of air (n=1) and hydrogenated amorphous silicon (n~4.23), weighted by volume at the interface between the air and the nanopillars or nanocones.

FIG. 8A depicts a comparison of the absorptivity, over a broad range of wavelengths, for different types of hydrogenated amorphous silicon substrates. Plot 800 provides: measured absorption for sample 802, which is a conventional planar layer of hydrogenated amorphous silicon; measured absorption for sample 804, which is a hydrogenated amorphous silicon nanopillar substrate in accordance with substrate 100; and measured absorption for sample 806, which is a hydrogenated amorphous silicon nanocone substrate in accordance with substrate 700. Wavelength dependency of the absorption of samples 802, 804, and 806 was measured using a broad-wavelength tungsten lamp coupled to a monochromator for controlling the wavelength of light over a range of wavelengths from 400 nm to 800 nm.

FIG. 8B depicts simulation results for the absorptivity, over a broad range of wavelengths, for different types of hydrogenated amorphous silicon substrates. Plot 808 provides simulated absorption for samples 802, 804, and 806. The simulation results are based on solutions of Maxwell's equations with rigorous coupled-wave analysis (RCWA). Transmitted and reflected waves were calculated and the absorption of the layers was derived from these waves.

For sample 802, the effective refractive index changes immediately from 4.23 to 1 across the flat film interface. This leads to significant reflection of light at this interface.

For sample 804, the nanopillar structure induces an intermediate refractive index step that reduces the reflectivity of the surface. Further, this intermediate refractive index step reduces the reflectivity of the sample over a broad range of wavelengths, as seen in plots 800 and 808. It should be noted that the density of the nanopillars affects the effective refractive index of the hydrogenated amorphous silicon surface and, therefore, its reflectivity.

For sample 806, the diameter of the projections shrinks gradually from their base at surface 106 to their top at surface 108. The transition from the refractive index of air to that of layer 102, therefore, is more smoothly graded than even that of sample 804. As a result, nanocone substrates are characterized by even lower reflectivity across a broad range of wavelengths, as seen in plots 800 and 808.

The measured absorption of the nanocone substrate was higher than 93% over the wavelength range between 400 and 650 nm. This represents 18% higher absorption over the absorption of the nanopillar substrate (~75%) over the same wavelength range. Both the nanopillar and nanocone substrates show markedly higher absorption than the planar layer (~64%) over this wavelength range, however.

A wavelength of 700 nm corresponds to the hydrogenated amorphous silicon band gap (1.75 eV). Interestingly, above 700 nm, the measured total absorption of the nanocone substrate only decreased to 88% while the absorption of the nanopillar substrate and planar layer decreased to 70% and 53%, respectively. It is clear, therefore, that the nanocone substrate demonstrates high absorption even for wavelengths above the band gap, a significant improvement.

The experimental data and simulations are well-matched. A small difference between experimental data and simulation near 700 nm wavelengths can be attributed to a lack of accurate parameters for simulation near the band gap of hydrogenated amorphous silicon.

FIG. 9A depicts a comparison of the absorptivity, over a broad range of angles of incidence, for different types of hydrogenated amorphous silicon substrates. Plot 900 provides: measured absorption for samples 802, 804, and 806 over angles of incidence within the range of 0 degrees to 90 degrees. Angular dependence of the samples was measured using absolute hemispherical measurements made with an integrating sphere and an argon-ion laser having a wavelength of 488 nm. The samples were mounted at the center of the sphere and reflected and transmitted light from the samples was uniformly scattered by the integrating sphere and collected by a photodetector.

FIG. 9B depicts simulation results for the absorptivity, over a broad range of angles of incidence, for different types of hydrogenated amorphous silicon substrates. Plot 908 provides simulated absorption for samples 802, 804, and 806 over angles of incidence within the range of 0 degrees to 90 degrees.

In similar fashion to the results of depicted in plots 800 and 808, over the broad range of angles of incidence, sample 806 (i.e., the nanocone sample) demonstrated higher absorption than samples 804 and 802 (i.e., the nanopillar and planar samples, respectively). At normal incidence, the measured absorption of sample 806 is 98.4%, which agrees well with the simulated value of 97.8%. This high absorption for nanocone substrates affords significant advantage over planar substrates (75%), and even nanopillar substrates (85%), for optoelectronic device applications.

As the angle of incidence increased, the total absorption decreased for all samples as total reflection increased. Absorption for sample 806, however, remained relatively high (>90%) up to an angle of incidence greater than 60 degrees. In all cases, the nanocone substrate showed significantly higher absorption than the nanopillar substrate, while the nanopillar substrate showed higher absorption than the planar substrate.

Angular dependence of the samples was measured using absolute hemispherical measurements made with an integrating sphere and an argon-ion laser having a wavelength of 488 nm. The samples were mounted at the center of the sphere and reflected and transmitted light from the samples was uniformly scattered by the integrating sphere and collected by a photodetector.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method for forming a substrate comprising a plurality of projections, wherein the method comprises:
    forming a mask layer on a first surface of the substrate, wherein the substrate comprises a first material, and wherein the mask layer comprises a plurality of first particles of a second material, and further wherein the plurality of first particles is arranged as a monolayer on the first surface;
    modifying the size of the first particles after the first particles are disposed on the first surface; and
    etching the substrate in a first etch, wherein the first etch etches the first material at a faster rate than that the second material.

2. The method of claim 1 wherein the mask layer is formed by operations comprising:
    immersing the substrate in a liquid having a surface layer of first particles; and
    removing the substrate from the first liquid such that first particles adhere to the first surface and form the plurality of first particles.

3. The method of claim 1 wherein the mask layer is formed such that the plurality of first particles is arranged as a close-packed monolayer on the first surface.

4. The method of claim 1 further comprising modifying the first particles such that each first particle has the same type of electrical charge.

5. The method of claim 4 wherein the first particles are modified by terminating them with positively charged amine groups.

6. The method of claim 1 further comprising controlling the size of the first particles by etching the first particles in a second etch that etches the second material at a faster rate than the first material.

7. The method of claim 1 wherein the substrate is etched in a reactive-ion etch that comprises the first etchant.

8. The method of claim 1 wherein the first etch is a reactive-ion etch that is a substantially anisotropic etch.

9. The method of claim 8 further comprising etching the substrate in a second etch that is a substantially isotropic etch.

10. The method of claim 1 further comprising removing the mask layer from the substrate.

11. The method of claim 1 wherein each projection of the plurality of projections is characterized by a physical characteristic, and wherein the method further comprises controlling the physical characteristic.

12. The method of claim 11 wherein the physical characteristic is a cross-sectional diameter.

13. The method of claim 11 wherein the physical characteristic is an angle of a sidewall.

14. The method of claim 11 wherein the physical characteristic is a radius of curvature of the tip of the projection.

15. The method of claim 1 wherein the arrangement of the plurality of projections is characterized by an arrangement characteristic, and wherein the method further comprises controlling the arrangement characteristic.

16. The method of claim 15 wherein the arrangement characteristic is the center-to-center spacing of the projections of the plurality of projections.

17. The method of claim 15 wherein the arrangement characteristic is the separation distance between the projections of the plurality of projections.

18. The method of claim 1 wherein the mask layer is formed such that the plurality of first particles is arranged as a hexagonal close-packed monolayer on the first surface.

19. A method for forming a substrate comprising a plurality of projections, wherein the method comprises:
    forming a monolayer of first particles comprising a first material on a first surface of the substrate comprising a second material;
    modifying the size of the first particles after the first particles are disposed on the first surface; and
    etching the substrate in a first etch, wherein the first etch etches the second material at a faster rate than the first material.

20. The method of claim 19 wherein the substrate comprises hydrogenated amorphous silicon, and wherein each of the monolayer of particles comprises silicon dioxide.

21. The method of claim 19 wherein the first etch is a reactive-ion etch that is a substantially anisotropic etch.

22. The method of claim 19 wherein the size of the first particles is modified by etching the first particles in a second etch, wherein the second etch etches the first material at a faster rate than the second material.

23. A method for forming a substrate comprising a plurality of projections, wherein the method comprises:
    providing a plurality of first particles, the first particles having the same type of electrical charge;
    forming a mask layer on a first surface of the substrate, wherein the substrate comprises a first material, and wherein the mask layer comprises the plurality of first particles of a second material, and further wherein the plurality of first particles is arranged as a monolayer on the first surface; and
    etching the substrate in a first etch, wherein the first etch etches the first material at a faster rate than that the second material.

24. The method of claim 23 further comprising modifying the size of the first particles after the first particles are disposed on the first surface.

25. The method of claim 22 wherein the size of the first particles is modified by etching the first particles in a second etch, wherein the second etch etches the first material at a faster rate than the second material.

26. The method of claim 23 wherein the first particles are provided such that each first particle is terminated with a positively charged amine group.

27. The method of claim 23 further comprising modifying the first particles by terminating them with positively charged amine groups.

28. The method of claim 23 further comprising controlling the radius of curvature of the tip of each projection of the plurality of projections, wherein each tip is characterized by a non-planar surface.

29. The method of claim 23 wherein each projection projects from a second surface of the substrate, and wherein each projection is characterized by a tip and a sidewall that forms a first angle with the second surface, the first angle being a non-right angle, and wherein the method further comprises controlling the first angle.

30. The method of claim 29 wherein the tip of each projection is characterized by finite radius of curvature, and wherein the method further comprises controlling the radius of curvature.

* * * * *